United States Patent
Lim et al.

(10) Patent No.: US 9,800,244 B2
(45) Date of Patent: Oct. 24, 2017

(54) INVERTER CIRCUITS WITH FIRST AND SECOND DRIVABILITY DEPENDENT ON FIRST OR SECOND TIME PERIOD

(71) Applicant: SK hynix Inc., Icheon-si, Gyeonggi-do (KR)

(72) Inventors: Jung Ho Lim, Seoul (KR); Jung Hwan Ji, Hwaseong-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/086,669

(22) Filed: Mar. 31, 2016

(65) Prior Publication Data

US 2017/0170831 A1    Jun. 15, 2017

(30) Foreign Application Priority Data

Dec. 9, 2015 (KR) .................. 10-2015-0175455

(51) Int. Cl.
*H03K 19/003* (2006.01)
*H03K 19/20* (2006.01)
*H03K 5/06* (2006.01)

(52) U.S. Cl.
CPC ......... *H03K 19/00384* (2013.01); *H03K 5/06* (2013.01); *H03K 19/20* (2013.01)

(58) Field of Classification Search
CPC ..... H03K 19/00384; H03K 5/06; H03K 19/20
USPC .......................................... 326/112–119, 121
See application file for complete search history.

(56) References Cited

U.S. PATENT DOCUMENTS

| | | | | |
|---|---|---|---|---|
| 5,166,555 A | * | 11/1992 | Kano | H03K 19/01721 326/31 |
| 5,719,509 A | * | 2/1998 | Chan | H03K 19/00361 326/27 |
| 6,281,706 B1 | * | 8/2001 | Wert | H03K 19/00361 326/121 |
| 6,924,669 B2 | * | 8/2005 | Itoh | H03K 19/00361 326/27 |
| 7,142,015 B2 | * | 11/2006 | Kuang | H03K 19/01721 326/27 |
| 7,388,404 B1 | * | 6/2008 | Miller | H03K 19/0005 326/31 |
| 9,229,465 B2 | * | 1/2016 | Dhiman | G05F 1/595 |
| 2006/0139058 A1 | * | 6/2006 | Maxwell | H03K 19/018585 326/58 |
| 2010/0060320 A1 | * | 3/2010 | Lee | G11C 7/1051 326/80 |
| 2010/0102872 A1 | | 4/2010 | Wu et al. | |
| 2014/0027765 A1 | | 1/2014 | Toyotaka | |

* cited by examiner

*Primary Examiner* — Dylan White
(74) *Attorney, Agent, or Firm* — William Park & Associates Ltd.

(57) ABSTRACT

An inverter circuit includes a pull-up control circuit and a pull-up drive circuit. The pull-up control circuit generates a drive signal which is enabled during a first time period in response to an input signal and an output signal. The pull-up drive circuit drives the output signal to a power supply voltage in response to the input signal and the drive signal. The pull-up drive unit drives the output signal with a first drivability during the first time period and drives the output signal with a second drivability during a second time period.

15 Claims, 10 Drawing Sheets

US 9,800,244 B2

INVERTER CIRCUITS WITH FIRST AND SECOND DRIVABILITY DEPENDENT ON FIRST OR SECOND TIME PERIOD

CROSS-REFERENCE TO RELATED APPLICATIONS

The present application claims priority under 35 U.S.C 119(a) to Korean Patent Application No. 10-2015-0175455, filed on Dec. 9, 2015, which is incorporated herein by reference in its entirety.

BACKGROUND

1. Technical Field

Embodiments of the present disclosure may generally relate to inverter circuits.

2. Related Art

As the operation time of semiconductor devices increases, performance and reliability of the semiconductor devices may be degraded. This degradation may be due to electrical and temperature stresses. Particularly, characteristics of PMOS transistors included in the semiconductor devices may be degraded due to a negative bias temperature instability (NBTI) phenomenon. This again, may cause performance degradation of the semiconductor devices.

The NBTI phenomenon means that a threshold voltage (an absolute value) of a PMOS transistor increases to reduce an on-current and a switching speed of the PMOS transistor after the PMOS transistor is turned on for a long time. That is, if the PMOS transistor is exposed to a condition causing the NBTI phenomenon, operation timing of the PMOS transistor may change. This may lead to timing errors of internal circuits of the semiconductor device. These timing errors may cause degradation of the performance and reliability of the semiconductor device.

SUMMARY

According to an embodiment, an inverter circuit may include a pull-up control circuit and a pull-up drive circuit. The pull-up control circuit may generate a drive signal which may be enabled during a first time period based on an input signal and an output signal. The pull-up drive circuit may drive the output signal to a power supply voltage based on the input signal and the drive signal. The pull-up drive circuit may drive the output signal with a first drivability during the first time period and may drive the output signal with a second drivability during a second time period.

According to an embodiment, an inverter circuit may include a pull-up drive circuit and a pull-down drive circuit. The pull-up drive circuit may drive an output signal to a power supply voltage based on an input signal and a drive signal. The pull-down drive circuit may drive the output signal to a ground voltage based on the input signal. The pull-up drive circuit may drive the output signal with a first drivability during a first time period and may drive the output signal with a second drivability during a second time period.

According to an embodiment, an inverter circuit may include a pull-up drive circuit. The pull-up drive circuit may drive an output signal to a power supply voltage based on an input signal and a drive signal. The pull-up drive circuit may use a first transistor to drive the output signal during a first time period and uses a second transistor to drive the output signal during a second time period after the first time period.

The first transistor has a higher drivability than the second transistor

The first transistor is only turned on during the first time period.

The first transistor pulls up the output signal from a logic low level to a logic high level and the second transistor maintains the output signal at a logic high level for a pull-up operation.

The first transistor includes a PMOS transistor different from a PMOS transistor included in the second transistor.

The pull-up drive circuit uses the first transistor, the second transistor, and a third transistor to drive the output signal during the first time period and only uses the second transistor to drive the output signal during the second time period.

The first, second, and third transistors have substantially the same drivability.

The first, second, and third transistors are all simultaneously turned on during the first time period.

The first transistor includes a PMOS transistor, the second transistor includes a PMOS transistor, and third transistor includes a third transistor.

The inverter circuit may further include a pull-up control circuit. The pull-up control circuit may generate the drive signal which is enabled during the first time period based on the input signal and the output signal.

The inverter circuit may further include a pull-down drive circuit. The pull-down drive circuit may drive the output signal to a ground voltage based on the input signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
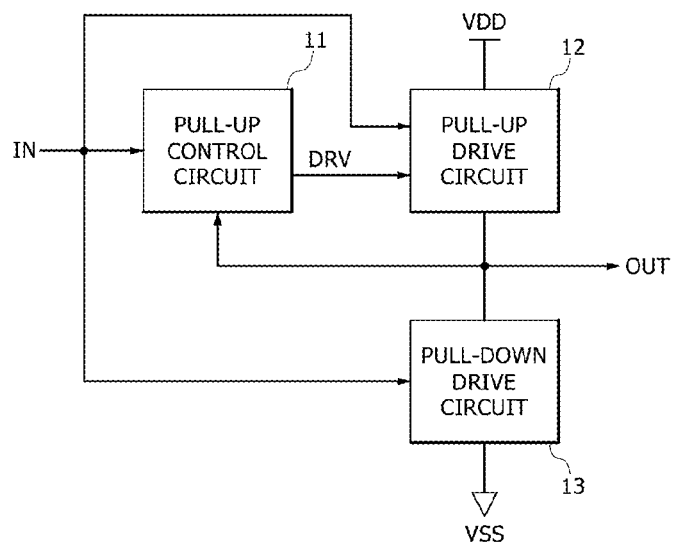
FIG. 1 is a block diagram illustrating a representation of an example of a configuration of an inverter circuit according to an embodiment.

Referring to FIG. 1, an inverter circuit according to an embodiment of the present disclosure may include a pull-up control circuit 11, a pull-up drive circuit 12, and a pull-down drive circuit 13.

The pull-up control circuit 11 may generate a drive signal DRV which is enabled during a first time period in response to an input signal IN and an output signal OUT. The first time period may be set to start at a point of time that the input signal IN is changed from a logic high level into a logic low level and to terminate at a point of time that the output signal OUT is changed from a logic low level into a logic high level. The pull-up control circuit 11 may output the input signal IN having a logic low level as the drive signal DRV during the first time period. At a point of time that the first time period terminates, the pull-up control circuit 11 may stop an operation for outputting the input signal IN as the drive signal DRV and may drive the drive signal DRV to a logic high level to disable the drive signal DRV.

The pull-up drive circuit 12 may drive the output signal OUT to a power supply voltage VDD in response to the input signal IN and the drive signal DRV. The pull-up drive circuit 12 may drive the output signal OUT with a first drivability during the first time period and may drive the output signal OUT with a second drivability during a second time period. The second time period may start at a point of time that the first time period terminates and may terminate at a point of time that the input signal IN is changed from a logic low level into a logic high level.

The pull-down drive circuit 13 may drive the output signal OUT to a ground voltage VSS in response to the input signal IN. The pull-down drive circuit 13 may drive the output signal OUT to the ground voltage VSS during a time period that the input signal IN has a logic high level.

Figure 2:
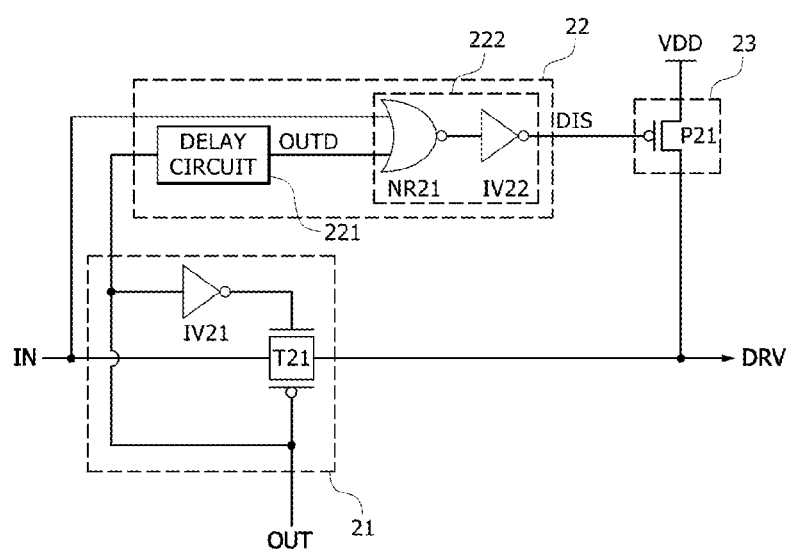
FIG. 2 is a circuit diagram illustrating a representation of an example of a pull-up control circuit included in the inverter circuit of FIG. 1.

Referring to FIG. 2, the pull-up control circuit 11 may include a transfer circuit 21, a drive termination control circuit 22, and a drive control circuit 23.

The transfer circuit 21 may include an inverter IV21 and a transfer gate T21. The inverter IV21 may inversely buffer the output signal OUT and may output the inversely buffered signal of the output signal OUT. The transfer gate T21 may output the input signal IN as the drive signal DRV in response to the output signal OUT. The transfer gate T21 may output the input signal IN as the drive signal DRV during the first time period in response to the output signal OUT. The transfer circuit 21 may output the input signal IN having a logic low level as the drive signal DRV during the first time period. The drive signal DRV may be enabled if the drive signal DRV has a logic low level. The transfer circuit 21 may stop an operation for outputting the input signal IN as the drive signal DRV during the second time period that the output signal OUT has a logic high level.

The drive termination control circuit 22 may include a delay circuit 221 and a logic circuit 222. The delay circuit 221 may delay the output signal OUT by a predetermined time period to generate a delayed output signal OUTD. The logic circuit 222 may include a NOR gate NR21 and an inverter IV22. The NOR gate NR21 may perform a NOR operation of the input signal IN and the delayed output signal OUTD and may output a result of the NOR operation. The inverter IV22 may inversely buffer an output signal of the NOR gate NR21 to generate a drive termination signal DIS. For example, the drive termination control circuit 22 may receive the input signal IN having a logic high level and the output signal OUT having a logic low level before the first time period to generate the drive termination signal DIS which is disabled to have a logic high level. The drive termination control circuit 22 may receive the input signal IN having a logic high level during the first time period to delay the input signal IN using the logic circuit 222 and to generate the drive termination signal DIS which is enabled during the second time period. In some embodiments, the logic circuit 222 may change the number or the drivability of inverters included in the logic circuit 222 to adjust a point of time that the drive termination signal DIS is generated.

The drive control circuit 23 may include a PMOS transistor P21. The drive control circuit 23 may disable the drive signal DRV in response to the drive termination signal DIS. For example, the drive control circuit 23 may drive the drive signal DRV to the power supply voltage VDD to disable the drive signal DRV if the drive termination signal DIS is enabled.

Figure 3:
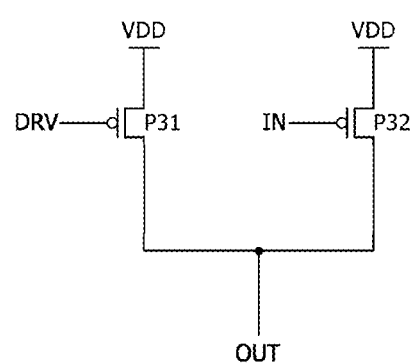
FIG. 3 is a circuit diagram illustrating a representation of an example of a pull-up drive circuit included in the inverter circuit of FIG. 1.

Referring to FIG. 3, the pull-up drive circuit 12 may include PMOS transistors P31 and P32. The PMOS transistors P31 and P32 may operate as pull-up elements which pull up the output signal OUT. The PMOS transistor P31 may drive the output signal OUT to the power supply voltage VDD in response to the drive signal DRV. The PMOS transistor P31 may drive the output signal OUT to the power supply voltage VDD in response to the drive signal DRV during the first time period. The PMOS transistor P32 may drive the output signal OUT to the power supply voltage VDD in response to the input signal IN. The PMOS transistor P32 may drive the output signal OUT to the power supply voltage VDD in response to the input signal IN having a logic low level during the first time period and the second time period. The PMOS transistor P31 may have a drivability which is higher than that of the PMOS transistor P32. The PMOS transistors P31 and P32 may be simultaneously turned on during the first time period. Since the PMOS transistor P31 has a drivability higher than that of the PMOS transistor P32, the output signal OUT may be driven to the power supply voltage VDD by the PMOS transistor P31 during the first time period. Only the PMOS transistor P32 may be turned on during the second time period. That is, the PMOS transistor P32 may perform an operation for keeping the output signal OUT having the power supply voltage VDD during the second time period. Hence, the PMOS transistor P31 may only drive the output signal OUT to the power supply voltage VDD, and the PMOS transistor P32 may only keep the output signal OUT having the power supply voltage VDD.

Figure 4:
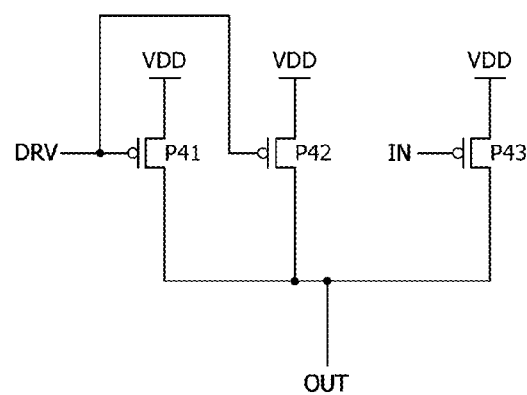
FIG. 4 is a circuit diagram illustrating a representation of an example of the pull-up drive circuit included in the inverter circuit of FIG. 1.

Referring to FIG. 4, the pull-up drive circuit 12 according to an example may include PMOS transistors P41, P42, and P43. The PMOS transistors P41, P42, and P43 may operate as pull-up elements which pull up the output signal OUT. The PMOS transistors P41 and P42 may drive the output signal OUT to the power supply voltage VDD in response to the drive signal DRV. The PMOS transistors P41 and P42 may drive the output signal OUT to the power supply voltage VDD in response to the drive signal DRV during the first time period. The PMOS transistor P43 may drive the output signal OUT to the power supply voltage VDD in response to the input signal IN. The PMOS transistor P43 may drive the output signal OUT to the power supply voltage VDD in response to the input signal IN having a logic low level during the first time period and the second time period. All of The PMOS transistors P41, P42, and P43 may have the same drivability. The PMOS transistors P41, P42, and P43 may be simultaneously turned on during the first time period. Since the PMOS transistors P41, P42, and P43 are simultaneously turned on during the first time period, the output signal OUT may be quickly driven to the power supply voltage VDD by the PMOS transistors P41, P42, and P43 which are turned on during the first time period. Only the PMOS transistor P43 may be turned on during the second time period. The PMOS transistor P43 may perform an operation for keeping the output signal OUT having the power supply voltage VDD during the second time period. Hence, the PMOS transistors P41, P42, and P43 may simultaneously drive the output signal OUT to the power supply voltage VDD, and only the PMOS transistor P43 may keep the output signal OUT having the power supply voltage VDD.

Figure 5:
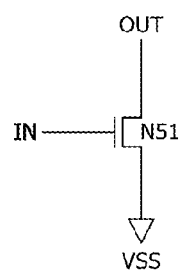
FIG. 5 is a circuit diagram illustrating a representation of an example of a pull-down drive circuit included in the inverter circuit of FIG. 1.

Referring to FIG. 5, the pull-down drive circuit 13 may include an NMOS transistor N51. The NMOS transistor N51 may operate as a pull-down element which drives the output signal OUT to the ground voltage VSS. The NMOS transistor N51 may drive the output signal OUT to the ground voltage VSS in response to the input signal IN.

Figure 6:
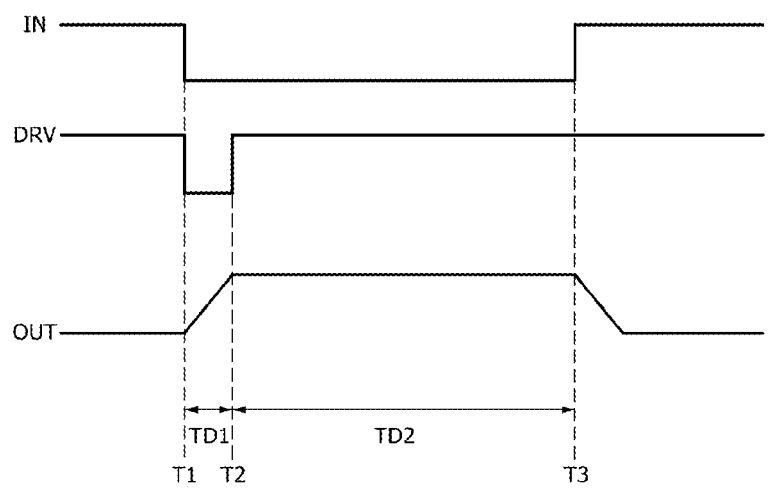
FIG. 6 is a timing diagram illustrating a representation of an example of an operation of the inverter circuit illustrated in FIGS. 1 to 5.

Referring to FIG. 6, the drive signal DRV may be enabled to have a logic low level during a first time period TD1 from a point of time T1 to a point of time T2. The point of time T1 may correspond to a point of time that the input signal IN is changed from a logic high level into a logic low level. The point of time T2 may be set to be a point of time that the output signal OUT reaches a logic high level from a logic low level. During the first time period TD1, the PMOS transistors P31 and P32 illustrated in FIG. 3 may be simultaneously turned on by the drive signal DRV and the input signal IN that have a logic low level, and the output signal OUT may be driven to the power supply voltage VDD by the PMOS transistor P31 having a drivability which is higher than a drivability of the PMOS transistor P32. During a second time period TD2 from the point of time T2 to a point of time T3, the drive signal DRV may be disabled to a logic high level. The point of time T3 may be set to be a point of time that the input signal IN is changed from logic low level to a logic high level. During the second time period TD2, the PMOS transistor P32 illustrated in FIG. 3 may be turned on in response to the input signal IN having a logic low level and may perform an operation for keeping the output signal OUT having a logic high level.

As described above, the inverter circuit according to an embodiment may include the PMOS transistor P31 which pulls up the output signal OUT from a logic low level into a logic high level and the PMOS transistor P32 which keeps the output signal OUT having a logic high level, if the inverter performs a pull-up operation. The PMOS transistor P31 may have a relatively high drivability and may be easily degraded by an NBTI phenomenon as compared with the PMOS transistor P32. However, according to an embodiment, the PMOS transistor P31 may be turned on only during the first time period TD1 that the output signal OUT is pulled up. Thus, the PMOS transistor P31 may not be degraded by an NBTI phenomenon. The PMOS transistor P32 may be turned on to keep the output signal OUT having a logic high level even during the second time period TD2, but the PMOS transistor P32 may have a relatively low drivability and may be relatively less sensitive to a stress which is due to the NBTI phenomenon as compared with the PMOS transistor P31. Accordingly, the inverter circuit according to an embodiment may have an excellent immunity from the NBTI phenomenon because the PMOS transistor P31 having a relatively high drivability is used to pull up the output signal OUT only during the first time period and the PMOS transistor P32 having a relatively low drivability but less sensitive to the NBTI phenomenon is used to keep the output signal OUT having a logic high level even during the second time period. In an embodiment, as illustrated in FIG. 4, the output signal OUT may be pulled up to have a logic high level by turning on all of the PMOS transistors P41, P42 and P43 having a relatively low drivability but less sensitive to the NBTI phenomenon during the first time period, and only the PMOS transistor P43 may be turned on to keep the output signal OUT having a logic high level during the second time period. Thus, the inverter circuit including the pull-up drive circuit 12 of FIG. 4 may also have an excellent immunity from the NBTI phenomenon.

Figure 7:
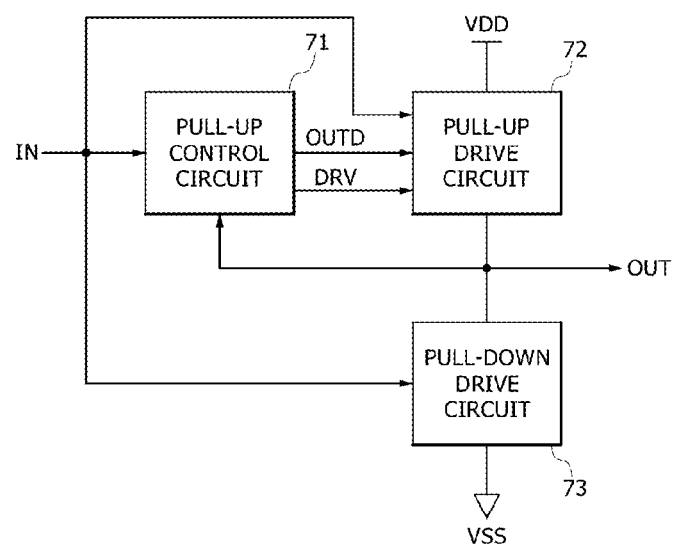
FIG. 7 is a block diagram illustrating a representation of an example of a configuration of an inverter circuit according to an embodiment.

Referring to FIG. 7, an inverter circuit according to an embodiment of the present disclosure may include a pull-up control circuit 71, a pull-up drive circuit 72, and a pull-down drive circuit 73.

The pull-up control circuit 71 may generate a drive signal DRV enabled in a first time period and a delayed output signal OUTD enabled in a second time period, in response to an input signal IN and an output signal OUT. The first time period may be set to start at a point of time that the input signal IN is changed from a logic high level into a logic low level and to terminate at a point of time that the output signal OUT is changed from a logic low level into a logic high level. The second time period may start at a point of time that the first time period terminates and may terminate at a point of time that the input signal IN is changed from a logic low level into a logic high level. The pull-up control circuit 71 may output the input signal IN having a logic low level as the drive signal DRV during the first time period. At a point of time that the first time period terminates, the pull-up control circuit 71 may stop an operation for outputting the input signal IN as the drive signal DRV and may drive the drive signal DRV to a logic high level to disable the drive signal DRV. The pull-up control circuit 71 may delay the output signal OUT to generate the delayed output signal OUTD which is enabled after a predetermined time period from a start point of time of the second time period.

The pull-up drive circuit 72 may drive the output signal OUT to a power supply voltage VDD in response to the input signal IN, the drive signal DRV, and the delayed output signal OUTD. The pull-up drive circuit 72 may drive the output signal OUT with a first drivability during the first time period and may drive the output signal OUT with a second drivability during the second time period.

The pull-down drive circuit 73 may drive the output signal OUT to a ground voltage VSS in response to the input signal IN. The pull-down drive circuit 73 may drive the output signal OUT to the ground voltage VSS during a time period that the input signal IN has a logic high level.

Figure 8:
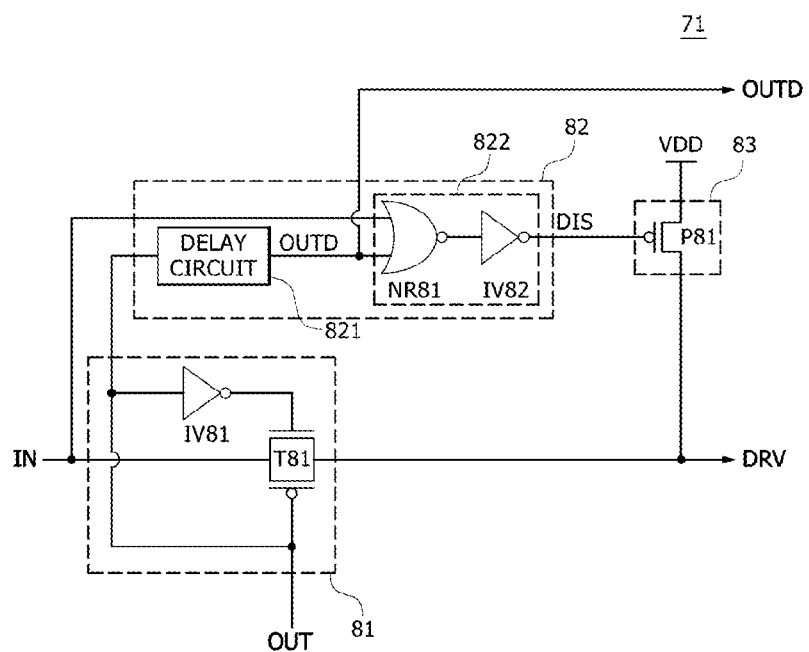
FIG. 8 is a circuit diagram illustrating a representation of an example of a pull-up control circuit included in the inverter circuit of FIG. 7.

Referring to FIG. 8, the pull-up control circuit 71 may include a transfer circuit 81, a drive termination control circuit 82, and a drive control circuit 83.

The transfer circuit 81 may include an inverter IV81 and a transfer gate T81. The inverter IV81 may inversely buffer the output signal OUT and may output the inversely buffered signal of the output signal OUT. The transfer gate T81 may output the input signal IN as the drive signal DRV in response to the output signal OUT. The transfer gate T81 may output the input signal IN as the drive signal DRV during the first time period in response to the output signal OUT. The transfer circuit 81 may output the input signal IN having a logic low level as the drive signal DRV during the first time period. The drive signal DRV may be enabled if the drive signal DRV has a logic low level. The transfer circuit 81 may stop an operation for outputting the input signal IN as the drive signal DRV during the second time period that the output signal OUT has a logic high level.

The drive termination control circuit 82 may include a delay circuit 821 and a logic circuit 822. The delay circuit 821 may delay the output signal OUT by a predetermined time period to generate the delayed output signal OUTD. The logic circuit 822 may include, for example, a NOR gate NR81 and an inverter IV82. The NOR gate NR91 may perform a NOR operation of the input signal IN and the delayed output signal OUTD and may output a result of the NOR operation. The inverter IV82 may inversely buffer an output signal of the NOR gate NR81 to generate a drive termination signal DIS. For example, the drive termination control circuit 82 may receive the input signal IN having a logic high level and the output signal OUT having a logic low level before the first time period to generate the drive termination signal DIS which is disabled to have a logic high level. During the first time period, the drive termination control circuit 82 may receive the input signal IN having a logic high level to delay the input signal IN using the logic circuit 822 and to generate the drive termination signal DIS which is enabled during the second time period. In some embodiments, the logic circuit 822 may change the number or the drivability of inverters included in the logic circuit 822 to adjust a point of time that the drive termination signal DIS is generated.

The drive control circuit 83 may include a PMOS transistor P81. The drive control circuit 83 may disable the drive signal DRV in response to the drive termination signal DIS. For example, the drive control circuit 83 may drive the drive signal DRV to the power supply voltage VDD to disable the drive signal DRV, if the drive termination signal DIS is enabled.

Figure 9:
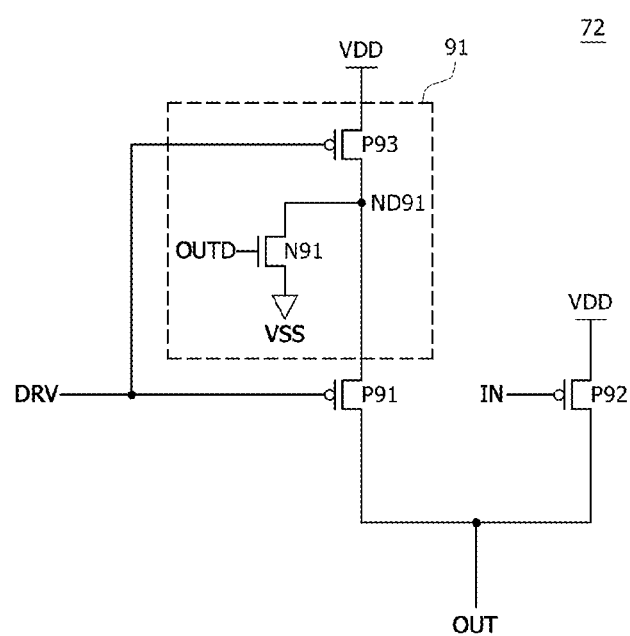
FIG. 9 is a circuit diagram illustrating a representation of an example of a pull-up drive circuit included in the inverter circuit of FIG. 7.

Referring to FIG. 9, the pull-up drive circuit 72 may include a power supply control circuit 91 and PMOS transistors P91 and P92.

The power supply control circuit 91 may include a PMOS transistor P93 and an NMOS transistor N91. The PMOS transistor P93 may drive a node ND91 to the power supply voltage VDD in response to the drive signal DRV which is enabled during the first time period. The NMOS transistor N91 may drive the node ND91 to the ground voltage VSS in response to the delayed output signal OUTD which is enabled after a predetermined time period from a start point of time of the second time period.

The PMOS transistors P91 and P92 may operate as pull-up elements which pull up the output signal OUT. The PMOS transistor P91 may drive the output signal OUT to a voltage of the node ND91 in response to the drive signal DRV. The PMOS transistor P91 may drive the output signal OUT to a voltage of the node ND91, which is driven to have the power supply voltage VDD, in response to the drive signal DRV which is enabled during the first time period. The PMOS transistor P92 may drive the output signal OUT to the power supply voltage VDD in response to the input signal IN. The PMOS transistor P92 may drive the output signal OUT to the power supply voltage VDD in response to the input signal IN having a logic low level during the first time period and the second time period. The PMOS transistor P91 may have a drivability which is higher than that of the PMOS transistor P92. The PMOS transistors P91 and P92 may be simultaneously turned on during the first time period. Since the PMOS transistor P91 has a drivability higher than that of the PMOS transistor P92 during the first time period, the output signal OUT may be driven to the power supply voltage VDD by the PMOS transistor P91. Only the PMOS transistor P92 may be turned on during the second time period. The PMOS transistor P92 may perform an operation for keeping the output signal OUT having the power supply voltage VDD during the second time period. Hence, the PMOS transistor P91 may only drive the output signal OUT to the power supply voltage VDD, and the PMOS transistor P92 may only keep the output signal OUT having the power supply voltage VDD. Accordingly, even if the output signal OUT is repeatedly driven to the power supply voltage VDD, the PMOS transistors P91 and P92 may have an excellent immunity from the NBTI phenomenon.

As described above, the inverter circuit according to an embodiment may interrupt that a power supply voltage is supplied to the PMOS transistor P91 in response to the delayed output signal OUTD, after a predetermined time period from a point of time that the first time period terminates to turn off the PMOS transistor P91. Thus, the PMOS transistor P91 may not be continuously turned on and the power supply voltage VDD may not be continuously supplied to the PMOS transistor P91. As a result, degradation of the PMOS transistor P91 may be suppressed.

Figure 10:
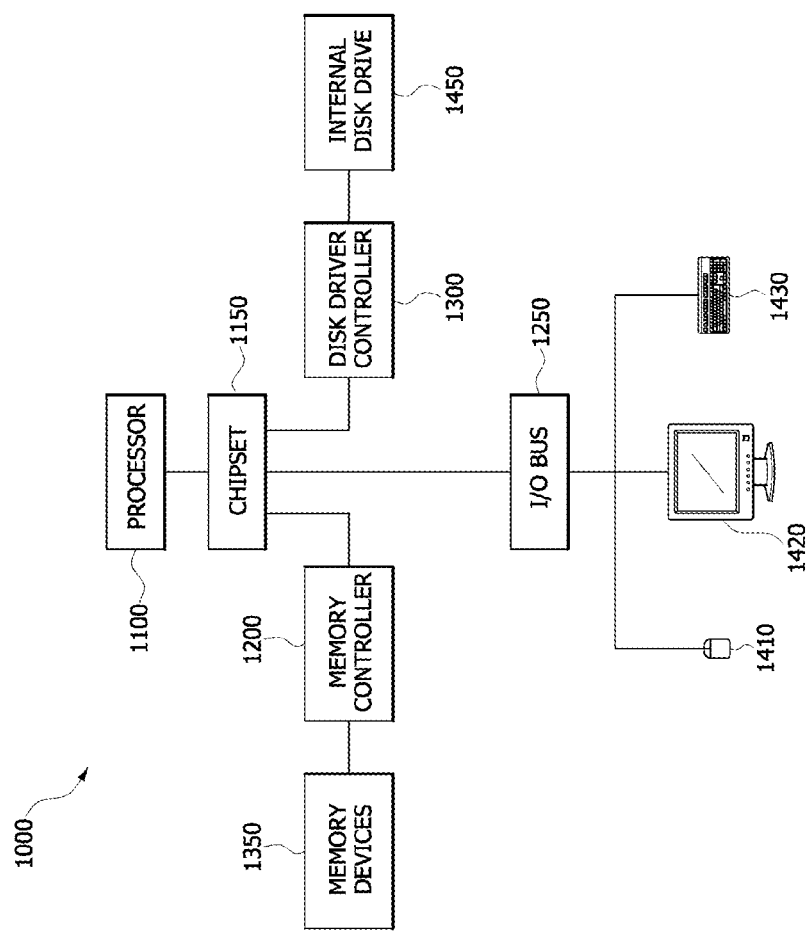
FIG. 10 illustrates a block diagram of an example of a representation of a system employing an inverter circuit with the various embodiments discussed above with relation to FIGS. 1-9.

The inverter circuits as discussed above (see FIGS. 1-9) are particular useful in the design of memory devices, processors, and computer systems. For example, referring to FIG. 10, a block diagram of a system employing an inverter circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one inverter circuit as discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one inverter circuit as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 10 is merely one example of a system 1000 employing an inverter circuit as discussed above with relation to FIGS. 1-9. In alternate embodiments, such as, for example but not limited to, cellular phones or digital cameras, the components may differ from the embodiments illustrated in FIG. 10.

What is claimed is:

1. An inverter circuit comprising:
   a pull-up control circuit configured for generating a drive signal, the drive signal enabled during a first time period in response to an input signal and an output signal; and
   a pull-up drive circuit configured for driving the output signal to a power supply voltage based on the input signal and the drive signal,
   wherein the pull-up drive circuit drives the output signal with a first drivability during the first time period and drives the output signal with a second drivability during a second time period,
   wherein the first drivability is higher than the second drivability,
   wherein a level of the output signal is changed during the first time period, and
   wherein the first time period starts based on a point of time that the input signal is changed from a first level into a second level and terminates based on a point of time that the output signal is changed from the second level into the first level.

2. The inverter circuit according to claim 1, wherein the second time period starts based on a point of time that the first time period terminates and terminates based on a point of time that the input signal is changed from a second level into a first level.

3. The inverter circuit according to claim 1, wherein the pull-up control circuit includes:
   a transfer circuit configured for outputting the input signal as the drive signal during the first time period based on the output signal;
   a drive termination control circuit configured for generating a drive termination signal which is enabled during the second time period based on the input signal and the output signal; and
   a drive control circuit configured for disabling the drive signal based on the drive termination signal.

4. The inverter circuit according to claim 3, wherein the drive termination control circuit delays the output signal to further generate a delayed output signal, the delayed output signal enabled during the second time period.

5. The inverter circuit according to claim 1, wherein the pull-up drive circuit includes:
   a first pull-up element configured for driving the output signal to the power supply voltage based on the drive signal; and
   a second pull-up element configured for driving the output signal to the power supply voltage based on the input signal.

6. The inverter circuit according to claim 5, wherein the first pull-up element has a drivability which is higher than a drivability of the second pull-up element.

7. The inverter circuit according to claim 5, wherein the pull-up drive circuit further includes a power supply control circuit configured for supplying the power supply voltage to the first pull-up element based on the drive signal during the first time period and configured for supplying a ground voltage to the first pull-up element based on a delayed output signal during the second time period.

8. The inverter circuit according to claim 5, wherein the pull-up drive circuit further includes a third pull-up element configured for driving the output signal to the power supply signal based on the drive signal.

9. The inverter circuit according to claim 1, further comprising a pull-down drive circuit configured for driving the output signal to a ground voltage based on the input signal.

10. An inverter circuit comprising:
    a pull-up drive circuit configured for driving an output signal to a power supply voltage based on an input signal and a drive signal; and
    a pull-down drive circuit configured for driving the output signal to a ground voltage based on the input signal,
    wherein the pull-up drive circuit drives the output signal with a first drivability during a first time period and drives the output signal with a second drivability during a second time period,
    wherein the first drivability is higher than the second drivability,
    wherein a level of the output signal is changed during the first time period, and
    wherein the first time period starts based on a point of time that the input signal is changed from a first level into a second level and terminates based on a point of time that the output signal is changed from the second level into the first level.

11. The inverter circuit according to claim 10, wherein the drive signal is enabled during the first time period.

12. The inverter circuit according to claim 10, wherein the second time period starts based on a point of time that the first time period terminates and terminates based on a point of time that the input signal is changed from a second level into a first level.

13. The inverter circuit according to claim 10, wherein the pull-up drive circuit includes:
    a first pull-up element configured for driving the output signal to the power supply voltage based on the drive signal; and
    a second pull-up element configured for driving the output signal to the power supply voltage based on the input signal.

14. The inverter circuit according to claim 13, wherein the first pull-up element has a drivability which is higher than a drivability of the second pull-up element.

15. The inverter circuit according to claim 13, wherein the pull-up drive circuit further includes a power supply control circuit configured for supplying the power supply voltage to the first pull-up element based on the drive signal during the first time period and configured for supplying the ground voltage to the first pull-up element based on a delayed output signal during the second time period.

\* \* \* \* \*